United States Patent [19]

Lee et al.

[11] Patent Number: 5,701,268

[45] Date of Patent: Dec. 23, 1997

[54] SENSE AMPLIFIER FOR INTEGRATED CIRCUIT MEMORY DEVICES HAVING BOOSTED SENSE AND CURRENT DRIVE CAPABILITY AND METHODS OF OPERATING SAME

[75] Inventors: Kyu-chan Lee, Seoul; Sang-bo Lee; Jai-hoon Sim, both of Kyungki-do, all of Rep. of Korea

[73] Assignee: Samsung Electronics Co., Ltd., Suwon, Rep. of Korea

[21] Appl. No.: 701,892

[22] Filed: Aug. 23, 1996

[30] Foreign Application Priority Data

Aug. 23, 1995 [KR] Rep. of Korea ............ 95-26185

[51] Int. Cl.⁶ .................................................. G11C 7/06
[52] U.S. Cl. .................. 365/205; 365/190; 365/222; 365/202; 365/233
[58] Field of Search ..................... 365/190, 205, 365/222, 202, 233

[56] References Cited

U.S. PATENT DOCUMENTS

| 4,736,343 | 4/1988 | Hidaka et al. | 365/203 |
| 4,803,386 | 2/1989 | Kraus et al. | 365/205 |

OTHER PUBLICATIONS

Koichiro Ishibashi et al., "A 12.5-ns 16Mb CMOS SRAM With Common–Centroid–Geometry–Layout Sense Amplifiers", IEEE Journal of Solid–State Circuits, vol. 29, No. 4, Apr. 1994, pp. 411–418.

Primary Examiner—David C. Nelms
Assistant Examiner—Andrew Q. Tran
Attorney, Agent, or Firm—Myers Bigel Sibley & Sajovec, L.L.P.

[57] ABSTRACT

Integrated circuit memory devices include at least first and second memory cells electrically coupled to respective first and second sense bit signal lines of a sense amplifier. The sense amplifier comprises a circuit for amplifying a difference in potential between the first and second sense bit signal lines by driving these lines to respective first and second different potentials. A driving circuit is also provided for simultaneously driving the first and second sense bit signal lines towards the first potential in response to application of a boost control signal. This driving circuit preferably comprises a first capacitor electrically connected in series between the boost control input and the first sense bit signal line and a second capacitor electrically connected in series between the boost control input and the second sense bit signal line. The boost control signal is established at the first potential to drive both the sense bit signal lines from different intermediate potentials (e.g., ½VCC+, ½VCC) towards the first potential, prior to amplification of the difference in potential between the first and second sense bit signal lines by the sense amplifier. The present invention enables the sense amplifier to operate in an environment where the power supply voltage (e.g., VCC) is reduced and the different intermediate potentials (e.g., ½VCC+, ½VCC) to be amplified are initially established at potentials below the normal sensitivity of the sense amplifier.

17 Claims, 5 Drawing Sheets

SENSE AMPLIFIER FOR INTEGRATED CIRCUIT MEMORY DEVICES HAVING BOOSTED SENSE AND CURRENT DRIVE CAPABILITY AND METHODS OF OPERATING SAME

FIELD OF THE INVENTION

The present invention relates to semiconductor memory devices and methods of operating same, and more particularly to semiconductor memory devices having sense amplifiers and methods of operating same.

BACKGROUND OF THE INVENTION

As the integration densities of semiconductor memory devices continue to increase, there is a continuing need to reduce the power supply voltages to these integrated memory devices to, among other things, minimize total power consumption and compensate for the smaller sizes of the discrete devices therein. In particular, in order to scale the size of MOS devices contained on a memory integrated circuit (IC), it is typically necessary to reduce the thickness of the gate oxide and linewidths of the gate electrodes and other interconnect lines connected to the MOS devices. Moreover, to achieve reliable operation of such reduced size devices, it is necessary to reduce the voltages at which these devices operate.

For example, in a 256-Mb dynamic random access memory (DRAM), it is typically necessary to reduce the external power supply voltage from 3.3 V, applied to the memory IC, to an internal voltage of about 1.5 V (i.e., VCC=1.5 V) in order to obtain reliable operation. However, as will be understood by those skilled in the art, decreases in operating voltage typically reduce the sensing, amplification and drive capability of amplifiers used to sense data stored in memory cells and limit the degree to which sense amplifiers can adequately refresh memory cells after a read operation.

An example of an integrated circuit memory device having a sense amplification circuit which is susceptible to reduced sensing, amplification and drive capability when reduced power supply voltages are used, is illustrated by FIGS. 1–2. In particular, FIG. 1 illustrates a conventional data sensing circuit for a semiconductor memory device containing first and second memory cell arrays 50 and 62 connected to pairs of memory bit signal lines BLi and BLBi and BLj and BLBj, respectively, which share a single sense amplifier 56. The data sensing circuit also contains identical first and second equalizing circuits 52 and 60 and identical first and second bit line isolation circuits 54 and 58, as illustrated. Here, i and j of BLBi and BLBj are integer numbers (e.g., 1,2,3, . . . N) and the reference characters containing the trailing "B" suffix represent the complement of the nominal reference character, i.e., BLBi represents the complementary memory bit signal line relative to the BLi memory bit signal line.

As illustrated, the memory cell arrays 50 and 62 each have a plurality of memory cells 12 for storing data of a predetermined level, upon activation of different word lines WLi, WLi+1, WLj, and WLj+1. The memory cells 12 each include an NMOS transistor 10 and a storage capacitor 8 for retaining a logic 0 or 1 voltage signal. For example, when a corresponding word line WLi connected to the gate of the NMOS transistor 10 connected to BLi is established at a logic 1 (e.g., "high") voltage level, an N-type inversion-layer channel is established opposite the gate. This channel electrically connects the source and drain regions of the transistor 10 together so that the logic level (e.g., Logic 1 or 0) of the first memory bit signal line BLi can be transferred to the storage capacitor 8.

The first equalizing circuit 52 is also provided for periodically establishing the first and second memory bit signal lines BLi and BLBi at the same intermediate potential (e.g., ½VCC). The first equalizing circuit contains three NMOS transistors 16, 18 and 20 which are connected between the first and second memory bit signal lines BLi and BLBi, as illustrated. The sources of the NMOS transistors 16 and 18 are connected to the first and second memory bit signal lines BLi and BLBi, respectively, and a bit line precharge voltage VBL is applied to their drains. The NMOS transistor 20 is connected between the first and second memory bit signal lines BLi and BLBi. The gates of the NMOS transistors 16, 18 and 20 are responsive to a first equalizing signal φEQi. When the level of the first equalizing signal φEQi is a logic 1 (i.e., "high"), the first equalizing circuit 52 causes the first and second memory bit signal lines BLi and BLBi to become precharged and equalized at the same intermediate potential. As illustrated, the second equalizing circuit 60 is also connected between the other memory bit signal line pair BLj and BLBj, and is responsive to a second equalizing signal φEQj.

The first bit line isolation circuit 54 is also connected to the first and second memory bit signal lines BLi and BLBi and the first and second sense bit signal lines SBL and SBLB and the second bit line isolation circuit 58 is connected to the second pair of memory bit signal lines BLj and BLBj and the first and second sense bit signal lines SBL and SBLB. In particular, the first bit line isolation circuit 54 contains first and second pass transistors 22 and 24 (shown as NMOS transistors). As illustrated, the first pass transistor 22 is electrically connected in series between the first memory bit signal line BLi and the first sense bit signal line SBL and the second pass transistor 24 is electrically connected in series between the second memory bit signal line BLBi and the second sense bit signal line SBLB. The pass transistors 22 and 24 of the first bit line isolation circuit 54 are responsive to the application of a first bit line isolation clock signal φISOi. Similarly, the pass transistors 22 and 24 of the second bit line isolation circuit 58 are responsive to the application of a second bit line isolation clock signal φISOj. Here, by disposing the first bit line isolation clock signal φISOi in a "high" state, the first and second pass transistors 22 and 24 can be disposed in a passing state, thereby electrically connecting the first and second memory bit signal lines BLi and BLBi to the first and second sense bit signal lines SBL and SBLB. Similarly, by disposing the second bit line isolation clock signal φISOj in a "high" state, the first and second pass transistors 22 and 24 can be disposed in a passing state, thereby electrically connecting the second pair of memory bit signal lines BLj and BLBj to the first and second sense bit signal lines SBL and SBLB. As will be understood by those skilled in the art, the first and second bit line isolation clock signals φIOSi and φIOSj are not made "high" simultaneously.

The sense amplifier 56, connected to the first and second sense bit signal lines SBL and SBLB, includes an N-type sense amplifier having NMOS transistors 26 and 28 and a P-type sense amplifier having PMOS transistors 32 and 34. A first connection node LAB, commonly shared by the sources of the NMOS transistors 26 and 28 in the N-type sense amplifier, is connected to the drain of an NMOS transistor 30 which is activated by the input of a logic "high" at a first control input to the sense amplifier (i.e., LANG). As illustrated, the source of the NMOS transistor 30 is connected to ground (e.g., VSS). In contrast, a second connection node LA, commonly shared by the sources of the PMOS transistors 32 and 34 in the P-type sense amplifier, is connected to the drain of a PMOS transistor 36 which is activated by the input of a logic "low" at a second control input to the sense amplifier (i.e., LAPG). In addition, the source of the PMOS transistor 36 is connected to a power supply voltage (e.g., VCC).

When the first node LAB is grounded by activating the NMOS transistor 30, the N-type sense amplifier senses the potentials of the first and second sense bit signal lines SBL and SBLB and amplifies any difference in potential therebetween. Here, the sense bit signal line having the lower potential is pulled down to VSS. However, when the second node LA is pulled to VCC by activating the PMOS transistor 36, the P-type sense amplifier pulls the sense bit signal line having the higher potential up to VCC. As will be understood by those skilled in the art, the potentials of the first and second sense bit signal lines SBL and SBLB are supplied to an input and output line pair IO and IOB via column selecting gates 31 and 35. The column selecting gates 31 and 35 can be activated by the output of a column decoder (not shown) for decoding a column address signal, namely, a column selecting line CSL.

Referring now to FIG. 2, the operation of the sense amplification circuit of FIG. 1 will be more fully described. For example, when the first and second equalizing signals φEQi and φEQj are maintained at "high" levels, the first and second equalizing circuits 52 and 60 precharge and equalize the potentials of the first and second memory bit signal lines BLi and BLBi and the second pair of memory bit signal lines BLj and BLBj to the level of the bit line precharge voltage VBL (e.g., ½VCC). Then, if the first equalizing signal φEQi toggles low for a data read operation with respect to the memory cells 12 of the first memory cell array 50, the first equalizing circuit 52 becomes disabled to thereby allow a difference in potential to be established across the first and second memory bit signal lines BLi and BLBi. Once this occurs, the first bit line isolation clock signal φISOi is maintained "high" thereby allow the first and second sense bit signal lines SBL and SBLB to "track" the potentials of the first and second memory bit signal lines BLi and BLBi by disposing the first and second NMOS transistors 22 and 24 in respective passing (i.e., conductive) states. However the second bit line isolation clock signal φISOj is toggled from high to low to electrically isolate the first and second sense bit signal lines SBL and SBLB from the second pair of memory bit signal lines.

In order to perform a memory read operation, the first word line WLi is made high so that the charge on the storage capacitor 8 is transferred to the first memory bit signal line BLi if the memory cell 12 connected to WLi and BLi is storing a logic 1. This transfer of stored charge will cause the potentials of the first and second memory bit signal lines to be developed as shown in FIG. 2. In particular, the potentials of the first memory bit and first sense bits signal lines BLi and SBL will rise from ½VCC→½VCC+, thereby establishing a difference in potential between the first sense bit signal line SBL and the second sense bit signal line SBLB.

After the difference in potentials of the memory bit signal line pair BLi and BLBi have been established, the N-type sense amplifier control signal LANG and the P-type sense amplifier control signal LAPG toggle from low to high and from high to low respectively, to activate the NMOS transistor 30 and the PMOS transistor 36. Here, the first node LAB is pulled to ground (e.g., VSS), while the second node LA is driven to the level of the power supply voltage Vcc.

As will be understood by those skilled in the art, the sense amplifier 56 then senses the difference in potential between BLi/SBL and BLBi/SBLB and amplifies the difference by driving the first sense bit signal line SBL to VCC while simultaneously driving the second sense bit signal line SBLB to VSS. The amplified potentials of the first and second memory bit signal lines BLi and BLBi are then applied to the input and output line pair IO and IOB via the column selecting gates 31 and 35 which are activated by the application of the column selecting line CSL.

As will be understood by those skilled in the art, the current driving capability of the sense amplifier 56 operated in the above-described manner is closely related to the operation speed and operating power supply voltage of the integrated circuit memory device, as described above. In particular, the current driving capability of the N-type sense amplifier is determined by the transconductance $G_m$ of the NMOS transistors 26 and 28 during the amplification operation. Here, the transconductance of the transistors is related to the power supply voltage by the following relationship:

$$G_m = \left(\frac{W}{L}\right) C_{ox} \mu_n \left(\frac{1}{2} V_{CC} - V_{THN}\right) \quad (1)$$

Accordingly, the transconductance $G_m$ of the NMOS transistors 22 and 24, with a power supply voltage VCC of 1.5 V and a threshold voltage $V_{THN}$ of the NMOS sense transistors of about 0.65 V, is about one-tenth as large as the transconductance $G_m$ that could be achieved using the same circuit connected to a power supply voltage Vcc of 3.3 V. Thus, the reduced power supply voltage results in reduced sense capability, where ½VCC≈$V_{THN}$, reduced amplification speed and reduced current drive capability. As will be understood by those skilled in the art, a reduced current drive capability also results in a reduced memory refresh capability when the amplified first and second sense bit signal lines SBL and SBLB are fed back to the memory cells 12 while the word line WLi is maintained at a high level.

Thus, notwithstanding the above-described sense amplification circuit, there continues to be a need to develop improved memory devices and sense amplification circuits which are compatible with the trend towards higher integration densities and can operate at reduced power supply voltages.

SUMMARY OF THE INVENTION

It is therefore an object of the present invention to provide improved sense amplifiers for integrated circuit memory devices, and methods of operating same.

It is another object of the present invention to provide sense amplifiers which have the capability of sensing and amplifying differential bit line signals from relatively low intermediate voltage levels, and methods of operating same.

It is still another object of the present invention to provide sense amplifiers having improved current drive and memory refresh capability, and methods of operating same.

These and other objects, features and advantages of the present invention are provided by integrated circuit memory devices which contain at least first and second memory cells electrically coupled to respective first and second sense bit signal lines (SBL, SBLB) of a sense amplifier. The sense amplifier is responsive to at least one control input (LANG, LAPG) and comprises means for amplifying a difference in potential between the first and second sense bit signal lines by driving these lines to respective first and second different potentials (e.g., VCC and VSS). The preferred memory device also comprises means, coupled to the first and second sense bit signal lines (SBL, SBLB), for simultaneously driving both of these lines towards the first potential (e.g., VCC) in response to application of a boost control signal (φBS) to a boost control input.

This driving means preferably comprises a first capacitor electrically connected in series between the boost control input and the first sense bit signal line and a second capacitor electrically connected in series between the boost control input and the second sense bit signal line. Here, the boost control signal (φBS) is established at the first potential (e.g., VCC) to drive both the sense bit signal lines (SBL, SBLB) from different intermediate potentials (e.g., ½VCC+, ½VCC) towards the first potential, prior to amplification of the difference in potential between the first and second sense bit signal lines by the sense amplifier (e.g., prior to application of the control signals to the at least one input (LANG, LAPG)). Accordingly, the present invention enables the sense amplifier to operate in an environment where the power supply voltage (e.g., VCC) is reduced and the different intermediate potentials (e.g., ½VCC+, ½VCC) to be amplified are initially established at potentials below the normal sensitivity of the sense amplifier (e.g., below the threshold voltage $V_{th}$ of the sense amplifier's sense transistors).

The present invention is also provided by methods of operating integrated circuit memory devices which include the steps of equalizing the voltage potential of the first and second sense bit signal lines at an intermediate potential (e.g., at ½VCC) and then establishing a difference in potential between the first and second sense bit signal lines by electrically connecting the first sense bit signal line to the first memory cell to read the cell. For example, this step can cause the first sense bit signal line to rise slightly in potential relative to the second sense bit signal line, to a level above the equalized intermediate potential (e.g., ½VCC+). Once the difference in potential has been established across the first and second sense bit signal lines, a step is performed to insure that both sense bit signal lines can be properly sensed by the sense amplifier. In particular, a step is performed to simultaneously drive both the first and second sense bit signal lines towards a first potential greater than the intermediate potential (e.g., →VCC), while maintaining the established difference in potential between the sense bit signal lines.

The potentials on the "boosted" sense bit signal lines are then amplified by the sense amplifier by driving the first sense bit signal line to the first potential (e.g., VCC) and the second sense bit signal line to the second potential (e.g., VSS) which is less than the intermediate potential (e.g., ½VCC). The memory cells are then refreshed by electrically connecting the "amplified" sense bit signal lines thereto using a pair of pass transistors which are connected as a bit line isolation circuit, for example. Preferably, the bit line isolation circuit is utilized to electrically disconnect ("isolate") the memory cells from the sense bit signal lines during the "boosting" step. This improves the efficiency of the boosting step and enables the sense amplifier to sense and amplify at higher rates with greater output drive capability.

DESCRIPTION OF PREFERRED EMBODIMENTS

The present invention will now be described more fully hereinafter with reference to the accompanying drawings, in which preferred embodiments of the invention are shown. This invention may, however, be embodied in different forms and should not be construed as limited to the embodiments set forth herein. Rather, these embodiments are provided so that this disclosure will be thorough and complete, and will fully convey the scope of the invention to those skilled in the art. Like numbers refer to like elements throughout.

Figure 1:
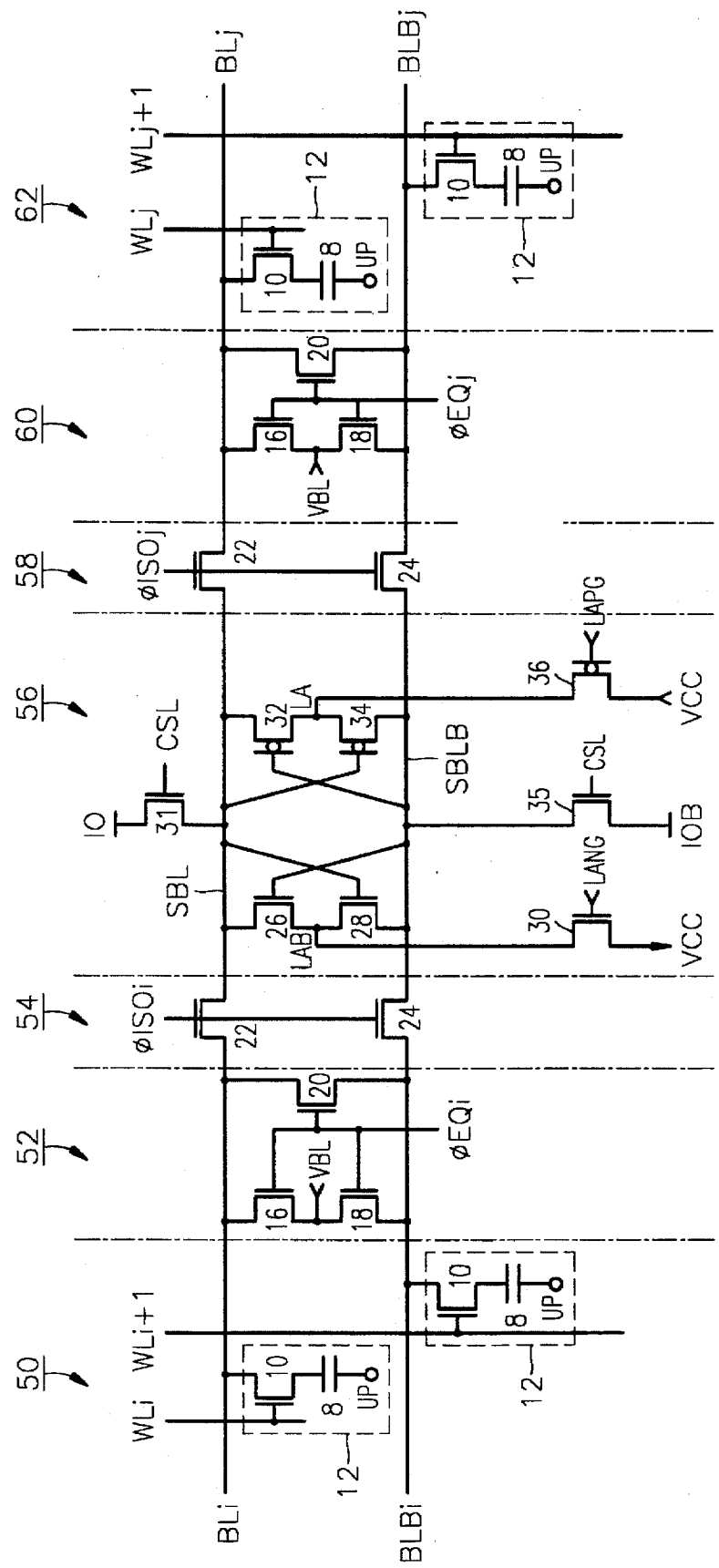
FIG. 1 illustrates a detailed electrical schematic of a data sensing circuit of a prior art integrated circuit memory device.
Figure 2:
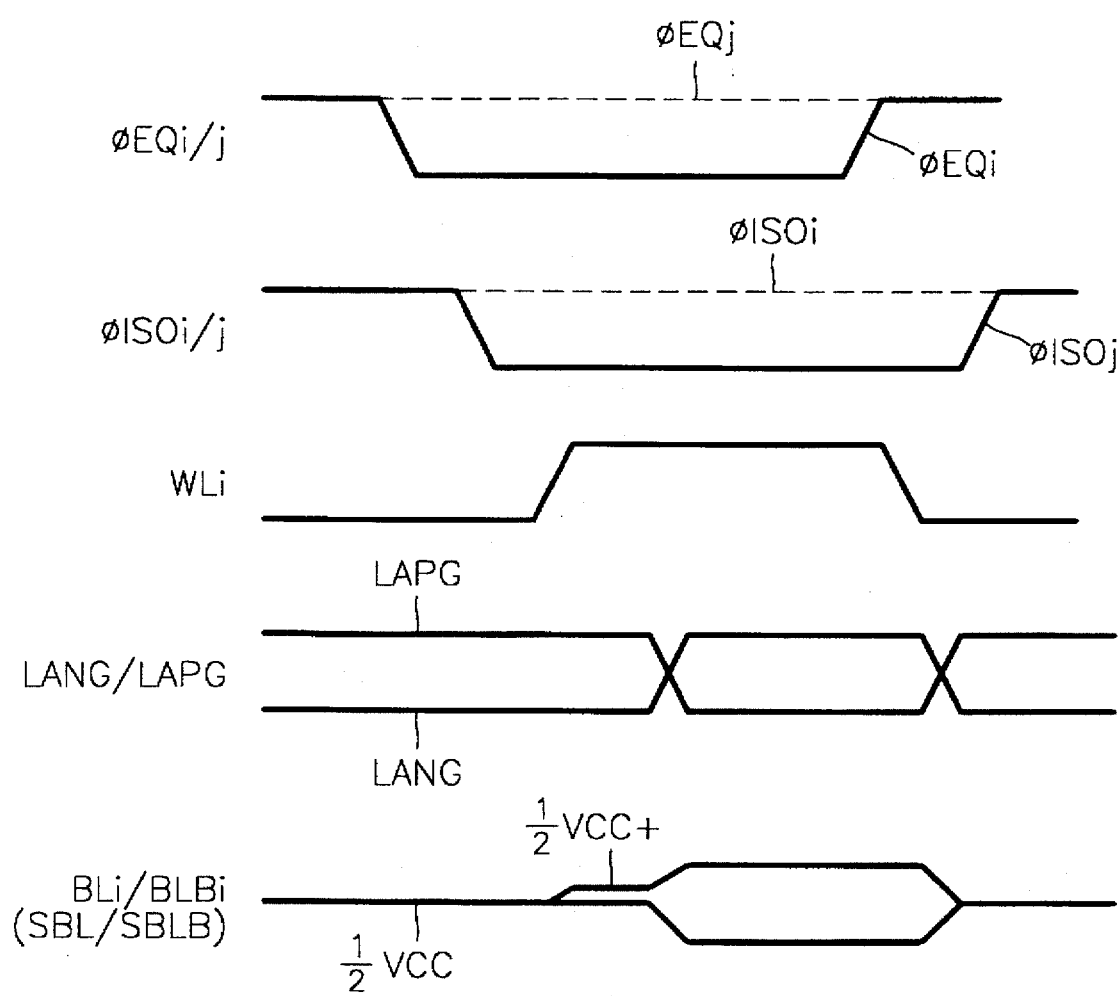
FIG. 2 is a diagram illustrating the timing of signals which control the operation of the data sensing circuit of FIG. 1.
Figure 3:
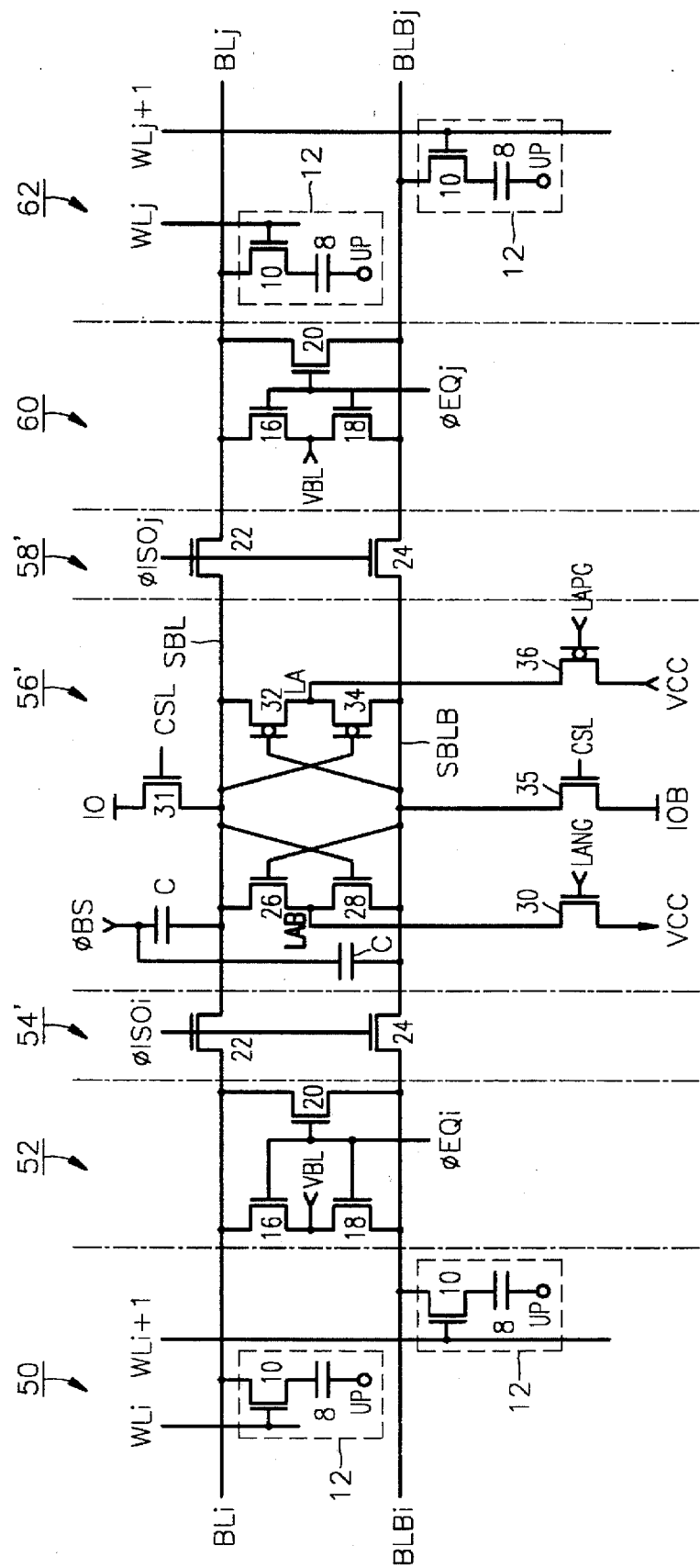
FIG. 3 illustrates a detailed electrical schematic of a data sensing circuit according to an embodiment of the present invention.

Referring now to FIGS. 3–6, an embodiment of an integrated circuit memory device having a preferred sense amplifier with "boosted" sense and current drive capability, and method of operating same, will be described. The integrated circuit memory device of FIG. 3 is similar to the integrated circuit memory device of FIG. 1, however, a refresh-isolation clock signal generator 64 and means for driving both the first and second sense bit signal lines SBL and SBLB towards a first potential in response to a boost control signal (φBS), are provided. As illustrated best by FIG. 3, the integrated circuit memory device may include at least first and second memory cells 12 electrically coupled to respective first and second sense bit signal lines SBL and SBLB of a sense amplifier 56'. The sense amplifier 56' is preferably responsive to application of first and second control signals ("1", "0") to a pair of control inputs (LANG, LAPG), respectively, and comprises means for amplifying a difference in potential (e.g., SBL>SBLB where SBL= ½VCC+ and SBLB=½VCC) between the first and second sense bit signal lines SBL and SBLB by driving these lines to respective first and second different potentials (e.g., VCC and VSS). The difference in potential between the first and second sense bit signal lines SBL and SBLB is established by performing a "read" operation of the memory cell 12 connected to a first word line WLi at time "A", as illustrated best in FIG. 4, and then passing the potentials of the first and second memory bit signal lines BLi and BLBi to the first and second sense bit signal lines SBL and SBLB by disposing the first bit line isolation circuit 54' in a passing state (i.e., φISOi=1). As described more fully hereinbelow, the first and second bit line isolation circuits 54' and 58' are responsive to first and second refresh-isolation clock signals (φISOi, φISOj) which are generated by a pair of refresh-isolation clock signal generators 64.

Figure 4:
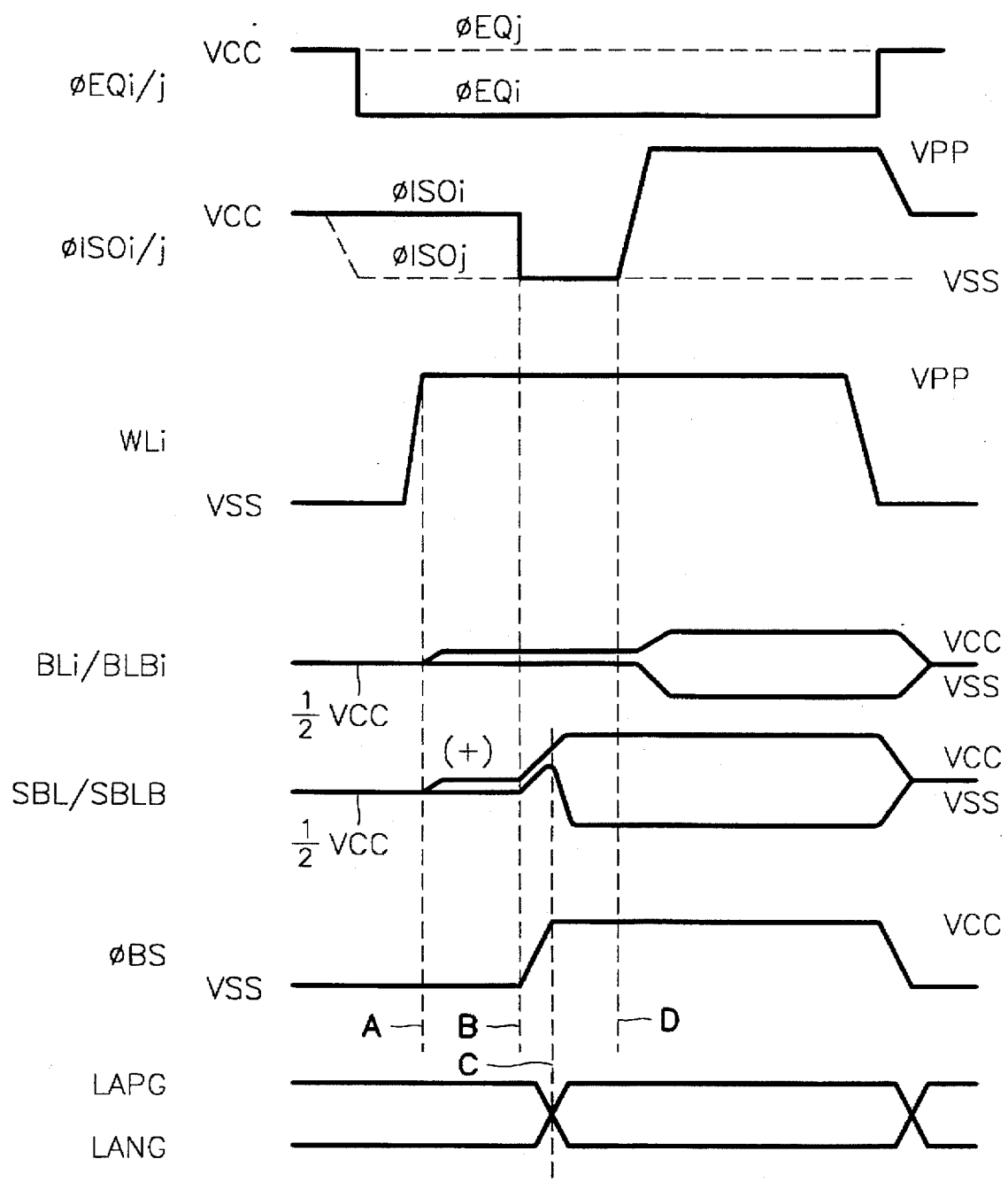
FIG. 4 is a diagram illustrating the timing of signals which control the operation of the data sensing circuit of FIG. 3.

In particular, when the first word line WLi is high as shown in FIG. 4, the NMOS transistor 10 of the corresponding memory cell 12 is turned-on and disposed in a passing state. Then, the potential of the data stored in the storage capacitor 8 (e.g., logic 1) is transferred to the first memory bit signal line BLi. During this transfer, charge is shared between the parasitic capacitances of the memory bit line pair BLi and BLBi and the parasitic capacitances of the sense bit line pair SBL and SBLB, thereby developing a potential difference between them, as illustrated in FIG. 4. Also, when the first word line WLi is high, a parasitic coupling capacitance between the first word line WLi and the first memory bit signal line BLi (i.e., an overlap capacitance between the gate and the drain of the NMOS transistor 10), is larger than the parasitic capacitance between the first word line WLi and the second memory bit signal line BLBi. Accordingly, the first memory bit signal line BLi will experience less noise than the second memory bit signal line BLBi.

The sense amplifier 56' also preferably comprises means, coupled to the first and second sense bit signal lines SBL and SBLB, for simultaneously driving both of the sense bit signal lines towards the first potential (e.g., VCC) in response to application of a boost control signal (φBS) at time "B". This preferred driving means preferably comprises a first capacitor C, electrically connected in series between the boost control input and the first sense bit signal line SBL, and a second capacitor C electrically connected in series between the boost control input and the second sense bit signal line SBLB. Here, the boost control signal (φBS) is switched 0→1 at time "B" to drive both the sense bit signal lines SBL and SBLB from different intermediate potentials (e.g., ½VCC+, ½VCC) towards the first potential (e.g., VCC), prior to amplification of the difference in potential between the first and second sense bit signal lines SBL and SBLB by the sense amplifier (e.g., prior to application of the control signals (1,0) to the pair of sense amplifier 56' control inputs LANG and LAPG at time "C"). Moreover, to improve the boost capability associated with capacitively coupling the first and second sense bit signal lines SBL and SBLB to VCC, beginning at time "B", the first bit line isolation circuit 54' is also switched from a passing state to a blocking state (i.e., φISOi=1→0), as described more fully hereinbelow with respect to FIGS. 5–6. This step electrically disconnects the memory bit signal lines BLi and BLBi from the sense bit signal lines SBL and SBLB and makes the effect of the capacitive coupling more pronounced (i.e., increases the rising slope of SBL and SBLB in the time interval between times "B" and "C"). As will be understood by those skilled in the art, the magnitude of the boosting voltage SBV associated with the sensing bit lines SBL and SBLB can be expressed as:

$$SBV = \frac{1}{2} Vcc + \left( \frac{C}{C_{BL}+C} Vcc \right) \quad (2)$$

where $C_{BL}$ is the parasitic capacitance of the sensing bit lines SBL and SBLB, and C is the value of the boost capacitors C in the sense amplifier 56'. Accordingly, the present invention enables the sense amplifier 56' to operate in an environment where the power supply voltage (e.g., VCC) is reduced and the different intermediate potentials (e.g., ½VCC+, ½VCC) to be amplified are initially established at potentials below the normal sensitivity of the sense amplifier (e.g., below the threshold voltage $V_{th}$ of the sense amplifier's sense transistors).

Figure 5:
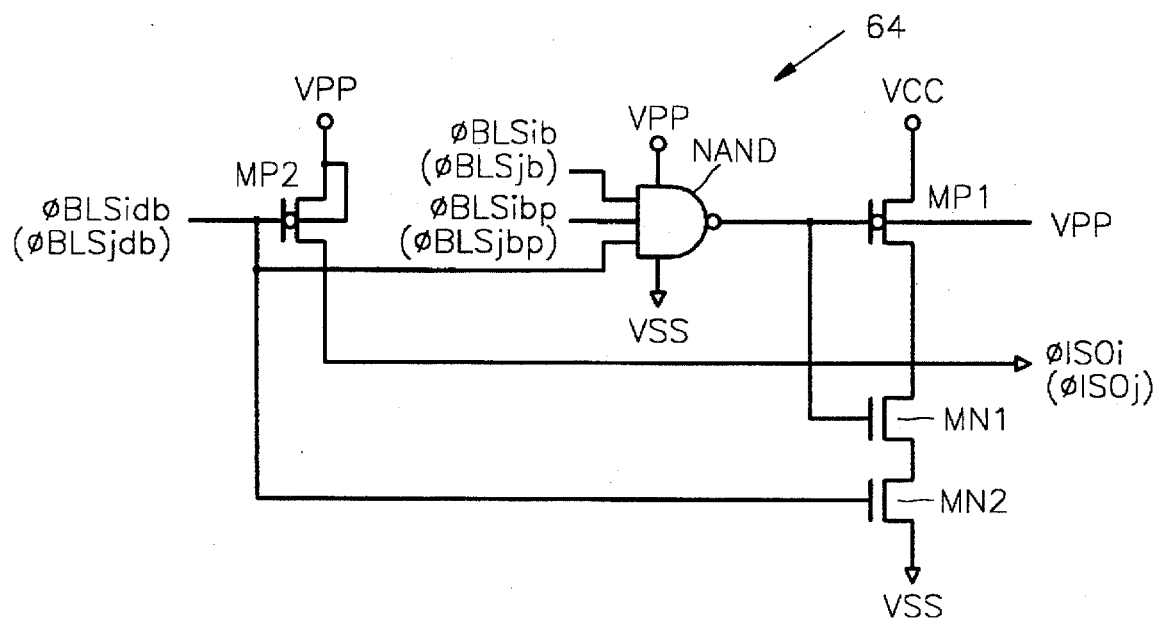
FIG. 5 illustrates a detailed electrical schematic of a refresh-isolation clock signal generator according to an embodiment of the present invention.

The refresh-isolation clock signal generator 64 of FIG. 5 also switches the first bit line isolation circuit 54' from a blocking state to a passing state at time "D" (i.e., i.e., φISOi=0→1). This switching step is performed so that the potentials of the first and second sense bit signal lines SBL and SBLB (e.g., VCC and VSS) can be fed back to refresh the memory cells 12 while the first word line WLi is maintained at a high level (e.g., VCC).

The establishment of the boosting voltage also causes the transconductance Gm of equation (1) to be increased at a rate Gmi as shown by equation (3) by operating the sense amplifier 56' with the developed potential of the sensing bit line pair SBL and SBLB increased as in equation (2). Thus, the current driving capability of the sense amplifier 56' is improved.

$$Gmi = \frac{\frac{1}{2} Vcc + \frac{C}{C_{BL}+C} Vcc - V_{THN}}{\frac{1}{2} Vcc - V_{THN}} \quad (3)$$

$$= 1 + \left( \frac{1}{\frac{1}{2} Vcc - V_{THN}} \cdot \frac{C}{C_{BL}+C} \right) Vcc$$

Here, the boosted voltage of the sensing bit line pair SBL and SBLB is made to be greater than the threshold voltage $V_{THN}$ of the NMOS transistors 26 and 28 of the sense amplifier 56', even if the power supply voltage is reduced. As described above, with the potentials of the sensing bit line pair SBL and SBLB boosted, the sense amplifier 56' sufficiently develops the potential difference between the boosted sensing bit lines SBL and SBLB, as shown in FIG. 4.

For example, if the operating voltage VCC of a semiconductor memory device is 1.5 V and the threshold voltage $V_{THN}$ of the NMOS transistors in the sense amplifier 56' is 0.65 V, the increase rate Gmi of the transconductance Gm of the sense amplifier according to the present invention is calculated from equation (3) to be increased by four times as shown in the following equation (4):

$$Gmi = 1 + \left( \frac{1}{0.75 - 0.65} \cdot \frac{1}{1+4} \right) 1.5 \quad (4)$$

where the sense bit line parasitic capacitance $C_{BL}$ is assumed to be one fourth as large as the boost capacitor C.

Figure 6:
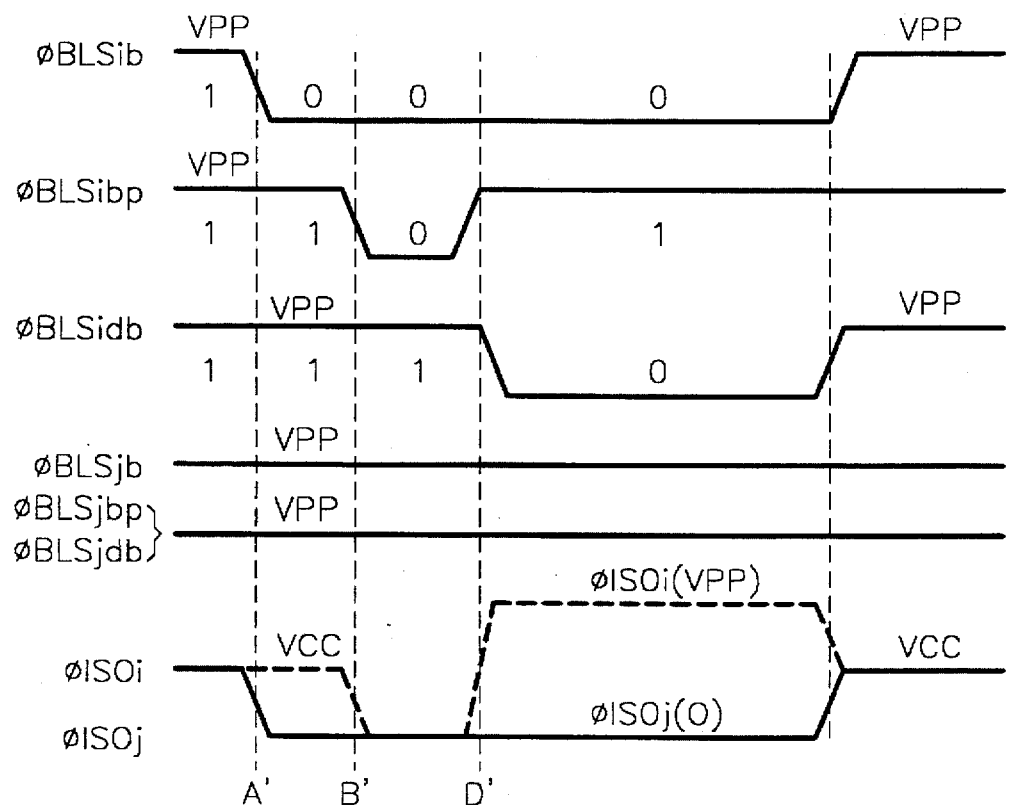
FIG. 6 is a diagram illustrating the timing of signals which control the operation of the refresh-isolation clock signal generator of FIG. 5.

Referring now to FIGS. 5 and 6, the operation of the refresh-isolation clock signal generators 64, which generate the first and second refresh-isolation clock signals φISOi and φISOj, will be described. In particular, a generator 64 comprises first and second pull-up transistors MP1 and MP2 which become conductive upon application of a logic 0 gate signal; first and second pull-down transistors MN1 and MN2 connected in series between an output (φISOi, φISOj) and VSS; and a three-input NAND gate for controlling the operation of the first pull-up transistor MP1 and the first pull-down transistor MN1. As illustrated, the generator is preferably connected to two different power supply levels (where VPP>VCC) so that the refresh-isolation clock signals can be switched from 0→VCC or 0→VPP.

In particular, as illustrated best by FIG. 6, the first refresh-isolation clock signal φISOi is switched from VCC→0 prior to commencement of the boost operation at time "B" in FIG. 4 by switching φBLSib from VPP→0 at time A'. This causes the output of the NAND gate to go from 0→1 and then after some delay turn on the first pull-down transistor MN1 at time B' (the second pull-down transistor MN2 is turned-on at times A' and B' because φBLSidb is at VPP during this time interval). The first refresh-isolation clock signal φISOi is then switched from 0→VPP at time "D'" (corresponding to time "D" in FIG. 4) by switching φBLSidb from VPP→0. As will be understood by those skilled in the art, this sequence of clock signals improves the rate at which the memory cells 12 are refreshed, by turning on the pass transistors in the first bit line isolation circuit 54' faster and harder.

The present invention is also provided by methods of operating integrated circuit memory devices which include the steps of equalizing the voltage potential of the first and second sense bit signal lines at an intermediate potential (e.g., at ½VCC) prior to time "A", then establishing a difference in potential between the first and second sense bit signal lines (commencing at time "A") by electrically connecting the first sense bit signal line to the first memory cell to read the cell. For example, this step can cause the first sense bit signal line to rise slightly in potential relative to the second sense bit signal line, to a level above the equalized intermediate potential (e.g., ½VCC+). Once the difference in potential has been established across the first and second sense bit signal lines SBL and SBLB, a step is performed to insure that both sense bit signal lines can be properly sensed by the sense amplifier. In particular, a step is performed commencing at time "B" to simultaneously drive both the first and second sense bit signal lines SBL and SBLB towards a first potential greater than the intermediate potential (e.g., →VCC), while maintaining the established difference in potential between sense bit signal lines.

The potentials on the "boosted" sense bit signal lines SBL and SBLB are then amplified by the sense amplifier 56' by driving the first sense bit signal line SBL to the first potential (e.g., VCC) and the second sense bit signal line SBLB to the second potential (e.g., VSS) which is less than the intermediate potential (e.g., ½VCC). The memory cells 12 are then refreshed by electrically connecting the "amplified" sense bit signal lines thereto using a pair of pass transistors which are connected as a bit line isolation circuit 54', for example. Preferably, the bit line isolation circuit is utilized to electrically disconnect the memory cells 12 from the sense bit signal lines SBL and SBLB during the "boosting" step. This improves the efficiency of the boosting step and enables the sense amplifier to sense and amplify at higher rates with greater output drive capability.

In the drawings and specification, there have been disclosed typical preferred embodiments of the invention and, although specific terms are employed, they are used in a generic and descriptive sense only and not for purposes of limitation, the scope of the invention being set forth in the following claims.

That which is claimed is:

1. An integrated circuit memory device, comprising:
   first and second memory cells electrically coupled to first and second sense bit signal lines;
   means, having at least one control input, for amplifying a difference in potential between the first and second sense bit signal lines by driving the first and second sense bit signal lines to respective first and second different potentials, in response to application of a first control signal to the at least one control input; and
   means, coupled to the first and second sense bit signal lines, for driving both the first and second sense bit signal lines towards the first potential, in response to application of a boost control signal prior to amplification of the difference in potential between the first and second sense bit signal lines.

2. The memory device of claim 1, further comprising:
   first and second memory bit signal lines electrically connected to said first and second memory cells, respectively; and
   a bit line isolation circuit containing a first pass transistor electrically connected in series between the first memory bit and sense bit signal lines and a second pass transistor electrically connected in series between the second memory bit and sense bit signal lines.

3. The memory device of claim 2, further comprising means, connected to an input of said bit line isolation circuit, for refreshing-isolating the first and second memory cells by switching the first and second pass transistors into respective passing states after application of the first control signal to the at least one control input.

4. The memory device of claim 3, wherein said refreshing-isolating means comprises means for switching the first and second pass transistors into respective blocking states during a first time interval commencing with the application of the boost control signal.

5. The memory device of claim 4, wherein the first time interval expires after the first and second sense bit signal lines have been driven to their respective first and second different potentials.

6. The memory device of claim 5, wherein said refreshing-isolating means comprises means for refreshing the first and second memory cells by switching the first and second pass transistors into respective passing states commencing at the expiration of the first time interval.

7. The memory device of claim 6, further comprising an equalizing circuit for precharging the first and second memory bit signal lines to an equal potential between the first and second different potentials, prior to application of the first control signal to the at least one control input.

8. The memory device of claim 7, wherein said means for driving both the first and second sense bit signal lines towards the first potential comprises a first capacitor electrically connected to the first sense bit signal line and a second capacitor electrically connected to the second sense bit signal line.

9. The memory device of claim 3, wherein said refreshing-isolating means comprises means for switching the first and second pass transistors from respective passing states, established by applying a first refresh-isolation clock signal having a potential equal to the first potential, to respective blocking states established by removing the first refresh-isolation clock signal during a first time interval commencing with the application of the boost control signal; and means for refreshing the first and second memory cells by switching the first and second pass transistors into respective passing states by applying a second refresh-isolation clock signal having a potential greater than the first potential at the expiration of the first time interval.

10. The memory device of claim 9, further comprising an equalizing circuit for precharging the first and second memory bit signal lines to an equal potential between the first and second different potentials, prior to application of the first control signal to the at least one control input.

11. The memory device of claim 10, wherein said means for driving both the first and second sense bit signal lines towards the first potential comprises a first capacitor electrically connected to the first sense bit signal line and a second capacitor electrically connected to the second sense bit signal line.

12. The memory device of claim 1, wherein said means for driving both the first and second sense bit signal lines towards the first potential comprises a first capacitor electrically connected to the first sense bit signal line and a second capacitor electrically connected to the second sense bit signal line.

13. A method of operating an integrated circuit memory device containing first and second memory cells and a bit line sense amplifier coupled to the first and second memory cells, comprising the steps of:
   equalizing the voltage potential of first and second sense bit signal lines electrically connected as inputs to the bit line sense amplifier, at an intermediate potential; then
   establishing a difference in potential between the first and second sense bit signal lines by electrically connecting the first sense bit signal line to the first memory cell; then simultaneously driving both the first and second sense bit signal lines towards a first potential greater than the intermediate potential, while maintaining the difference in potential therebetween; and then amplifying the difference in potential between the first and second sense bit signal lines by simultaneously driving the first sense bit signal line to the first potential and the second sense bit signal line to a second potential less than the intermediate potential.

14. The method of claim 13, wherein said amplifying step is followed by the step of refreshing at least the first memory cell by electrically connecting the first sense bit signal line thereto.

15. The method of claim 14, wherein said equalizing step comprises the step of electrically connecting the first sense bit signal line to the first memory cell; and wherein said step of establishing a difference in potential is followed by the step of electrically disconnecting the first sense bit signal line from the first memory cell during said step of simultaneously driving both the first and second sense bit signal lines towards the first potential.

16. The method of claim 15, wherein said step of simultaneously driving both the first and second sense bit signal lines towards the first potential comprises capacitively coupling the first and second sense bit signal lines to the first potential.

17. The method of claim 16, wherein said step of capacitively coupling the first and second sense bit signal lines to the first potential and said amplifying step are performed during respective time intervals which overlap.

* * * * *

UNITED STATES PATENT AND TRADEMARK OFFICE
CERTIFICATE OF CORRECTION

PATENT NO. : 5,701,268
DATED : December 23, 1997
INVENTOR(S) : Lee et al.

It is certified that error appears in the above-identified patent and that said Letters Patent is hereby corrected as shown below:

Title page,
Item [56], References Cited, U.S. PATENT DOCUMENTS, insert omitted references:
-- US-6,199,024   03-2001   Bunimovich et al.   702/95
   US-4,945,501   07-1990   Bell et al.         702/95
   US-4,819,195   04-1989   Bell et al.         702/95
   US-5,953,687   09-1999   Zink et al.         702/168
   US-5,665,896   09-1997   McMurtry, David R.  73/1.75
   US-5,649,368   07-1997   Herzog et al.       33/502
   US-5,125,261   06-1992   Powley, David G.    73/1.81 --
FOREIGN PATENT DOCUMENTS, insert omitted reference:
-- JP 07146130 A   06-1995   Japan   NODA et al.   G01B 21/00 --

Signed and Sealed this

Thirteenth Day of July, 2004

JON W. DUDAS
*Acting Director of the United States Patent and Trademark Office*